(12) United States Patent
Son et al.

(10) Patent No.: US 11,043,333 B2
(45) Date of Patent: Jun. 22, 2021

(54) COMPOSITE ELECTRONIC COMPONENT

(71) Applicant: SAMSUNG ELECTRO-MECHANICS CO., LTD., Suwon-si (KR)

(72) Inventors: Soo Hwan Son, Suwon-Si (KR); Ho Yoon Kim, Suwon-Si (KR); Sang Soo Park, Suwon-Si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 65 days.

(21) Appl. No.: 16/197,331

(22) Filed: Nov. 20, 2018

(65) Prior Publication Data

US 2020/0105474 A1  Apr. 2, 2020

(30) Foreign Application Priority Data

Sep. 28, 2018 (KR) .................. 10-2018-0116226

(51) Int. Cl.
*H01G 4/005* (2006.01)
*H01G 4/30* (2006.01)
(Continued)

(52) U.S. Cl.
CPC ............ *H01G 4/30* (2013.01); *H01G 4/005* (2013.01); *H01G 4/1218* (2013.01);
(Continued)

(58) Field of Classification Search
CPC .......... H01G 4/30; H01G 4/232; H01G 4/248; H01G 4/005; H01G 4/1218; H01G 4/228; H05K 1/0216; H05K 1/181
(Continued)

(56) References Cited

U.S. PATENT DOCUMENTS

2015/0116898 A1* 4/2015 Takashima ............ H01G 4/012
361/301.4
2015/0270065 A1* 9/2015 Hattori ................... H01G 2/065
174/255

(Continued)

FOREIGN PATENT DOCUMENTS

| JP | 5012658 B2 | 8/2012 |
|----|------------|--------|
| JP | 2014-042037 A | 3/2014 |
| JP | 2014-179583 A | 9/2014 |

*Primary Examiner* — Arun Ramaswamy
(74) *Attorney, Agent, or Firm* — Morgan, Lewis & Bockius LLP

(57) ABSTRACT

A composite electronic component includes: a composite body including a multilayer ceramic capacitor coupled to a ceramic chip, the multilayer ceramic capacitor including a first ceramic body in which a plurality of dielectric layers and internal electrodes disposed to face each other with each of the dielectric layers interposed therebetween are stacked and first and second external electrodes disposed on opposite end portions of the first ceramic body in a length direction, respectively, and the ceramic chip including a second ceramic body including ceramic and first and second terminal electrodes, wherein a ratio of a length of the ceramic chip to a length of the multilayer ceramic capacitor is 0.7 to 1.0, and a ratio of a sum of a length of the first terminal electrode and a length of the second terminal electrode to the length of the ceramic chip is 0.3 to 0.6.

18 Claims, 5 Drawing Sheets

(51) Int. Cl.
    *H01G 4/12*      (2006.01)
    *H01G 4/228*     (2006.01)
    *H05K 1/02*      (2006.01)
    *H05K 1/18*      (2006.01)

(52) U.S. Cl.
    CPC .......... *H01G 4/228* (2013.01); *H05K 1/0216* (2013.01); *H05K 1/181* (2013.01); *H05K 2201/10636* (2013.01)

(58) Field of Classification Search
    USPC ......... 361/301.4, 321.1, 321.2, 321.3, 306.3; 174/258, 259, 260
    See application file for complete search history.

(56)  References Cited

U.S. PATENT DOCUMENTS

| | | |
|---|---|---|
| 2016/0007446 A1 | 1/2016 | Ishikawa et al. |
| 2016/0133386 A1* | 5/2016 | Park .................... H05K 3/301 361/767 |

\* cited by examiner

COMPOSITE ELECTRONIC COMPONENT

CROSS-REFERENCE TO RELATED APPLICATION(S)

This application claims the benefit of priority to Korean Patent Application No. 10-2018-0116226 filed on Sep. 28, 2018, in the Korean Intellectual Property Office, the disclosure of which is incorporated herein by reference in its entirety.

TECHNICAL FIELD

The present disclosure relates to a composite electronic component.

BACKGROUND

A multilayer ceramic capacitor, a multilayer electronic component, is a chip type condenser mounted on circuit boards of several electronic products such as an image device, for example, a liquid crystal display (LCD), a plasma display panel (PDP), and the like, a computer, a personal digital assistant (PDA), a cellular phone, and the like, serving to charge or discharge electricity therein or therefrom.

The multilayer ceramic capacitor (MLCC) may be used as a component of various electronic apparatuses, since it has a small size, implements high capacitance, and is easily mounted.

The multilayer ceramic capacitor may include a plurality of dielectric layers and internal electrodes alternately stacked between the dielectric layers and having different polarities.

Since the dielectric layers have piezoelectric and electrostrictive characteristics, a piezoelectric phenomenon may occur between the internal electrodes when a direct current (DC) or alternating current (AC) voltage is applied to the multilayer ceramic capacitor, such that vibrations may be generated.

These vibrations are transferred to the circuit board on which the multilayer ceramic capacitor is mounted through external electrodes of the multilayer ceramic capacitor, such that the entirety of the circuit board becomes a sound reflecting surface to generate a vibration sound, known as noise.

The vibration sound may correspond to an audio frequency in a range of 20 to 20,000 Hz causing listener discomfort. The vibration sound causing listener discomfort as described above is known as acoustic noise.

The acoustic noise appears at a level at which it may be sufficiently recognized by a user as an electronic device is used together with a printed circuit board in an environment in which a voltage is high and a change in the voltage is large, in accordance with recent slimness and miniaturization of the electronic device.

Therefore, a new product in which acoustic noise is decreased has been continuously demanded.

Meanwhile, a composite electronic component in which a board is used on a lower surface of the multilayer ceramic capacitor in order to decrease acoustic noise has been studied.

However, detailed research into a removal level of acoustic noise depending on a size of the multilayer ceramic capacitor, a manner of mounting the multilayer ceramic capacitor, a size of a ceramic chip disposed below the multilayer ceramic capacitor, and a size of an electrode disposed on the ceramic chip may be insufficient. Therefore, research for determining critical points depending on the size of the multilayer ceramic capacitor, the manner of mounting the multilayer ceramic capacitor, the size of the ceramic chip disposed below the multilayer ceramic capacitor, and the size of the electrode disposed on the ceramic chip, and an influence level of the acoustic noise has been required.

SUMMARY

An aspect of the present disclosure may provide a composite electronic component in which acoustic noise may be decreased.

According to an aspect of the present disclosure, a composite electronic component may include: a composite body formed by coupling a multilayer ceramic capacitor and a ceramic chip to each other, the multilayer ceramic capacitor including a first ceramic body in which a plurality of dielectric layers and internal electrodes disposed to face each other with each of the dielectric layers interposed therebetween are stacked and first and second external electrodes disposed on opposite end portions of the first ceramic body, respectively, and the ceramic chip being disposed below the multilayer ceramic capacitor and including a second ceramic body including ceramic and first and second terminal electrodes disposed on opposite end portions of the second ceramic body, respectively, and connected to the first and second external electrodes, respectively, wherein a ratio of a length of the ceramic chip to a length of the multilayer ceramic capacitor is 0.7 to 1.0, and a ratio of a sum of a length of the first terminal electrode and a length of the second terminal electrode to the length of the ceramic chip is 0.3 to 0.6.

According to another aspect of the present disclosure, a composite electronic component may include: a composite body formed by coupling a multilayer ceramic capacitor and a ceramic chip to each other, the multilayer ceramic capacitor including a first ceramic body in which a plurality of dielectric layers and internal electrodes disposed to face each other with each of the dielectric layers interposed therebetween are stacked and first and second external electrodes disposed on opposite end portions of the first ceramic body, respectively, and the ceramic chip being disposed below the multilayer ceramic capacitor and including a second ceramic body including ceramic and first and second terminal electrodes disposed on opposite end portions of the second ceramic body, respectively, and connected to the first and second external electrodes, respectively, wherein a ratio of a width of the ceramic chip to a width of the multilayer ceramic capacitor is 0.7 to 1.0, and a ratio of a width of each of the first and second terminal electrodes to the width of the ceramic chip is 0.7 to 1.0.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
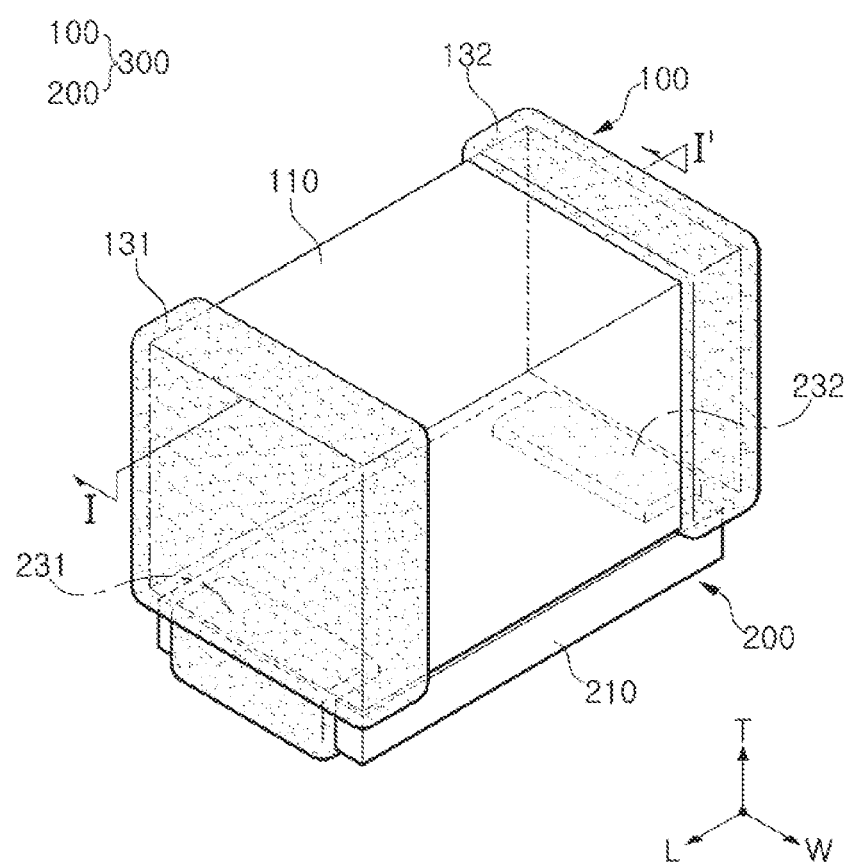
FIG. 1 is a schematic perspective view illustrating a composite electronic component according to an exemplary embodiment in the present disclosure.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Composite Electronic Component

Hereinafter, exemplary embodiments in the present disclosure will be described with reference to the accompanying drawings.

FIG. 1 is a schematic perspective view illustrating a composite electronic component according to an exemplary embodiment in the present disclosure.

Figure 2:
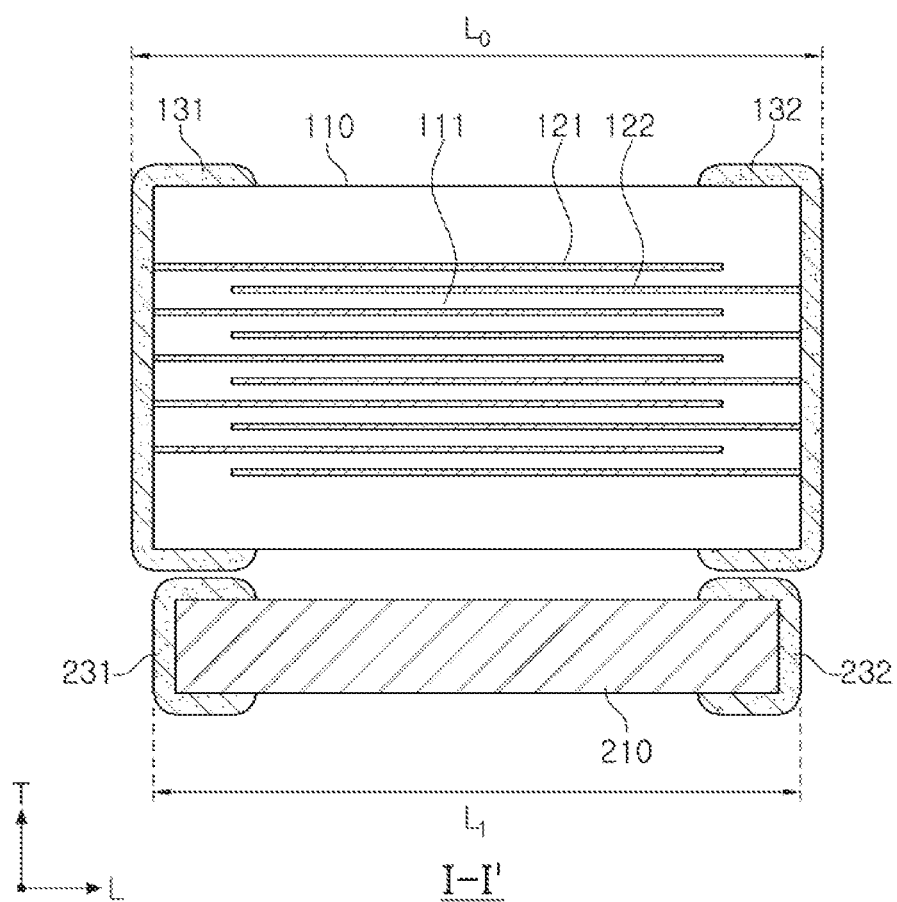
FIG. 2 is a cross-sectional view taken along line I-I' of FIG. 1.

FIG. 2 is a cross-sectional view taken along line I-I' of FIG. 1.

Figure 3:
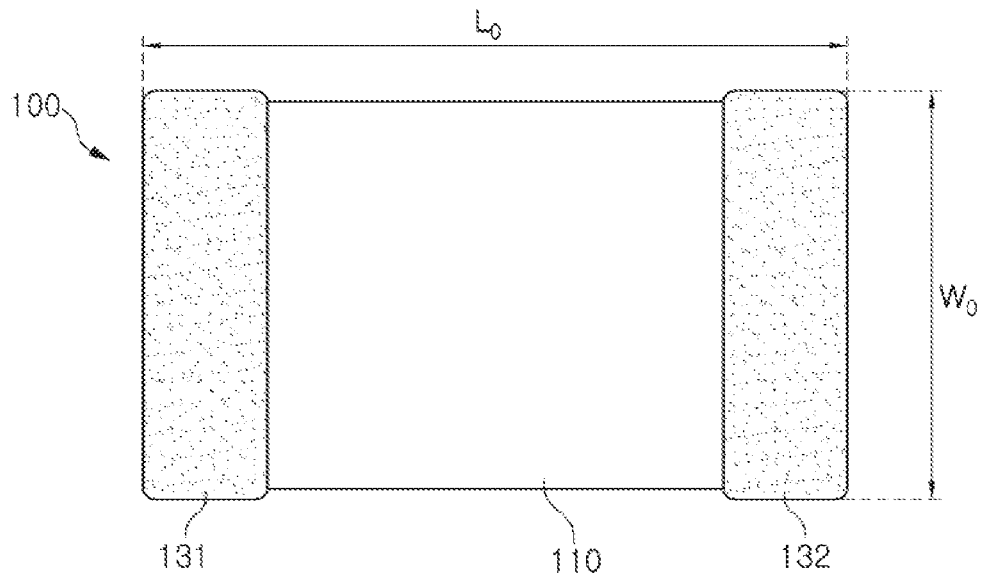
FIG. 3 is a top plan view of a multilayer ceramic capacitor of the composite electronic component of FIG. 1.

FIG. 3 is a top plan view of a multilayer ceramic capacitor of the composite electronic component of FIG. 1.

Figure 4:
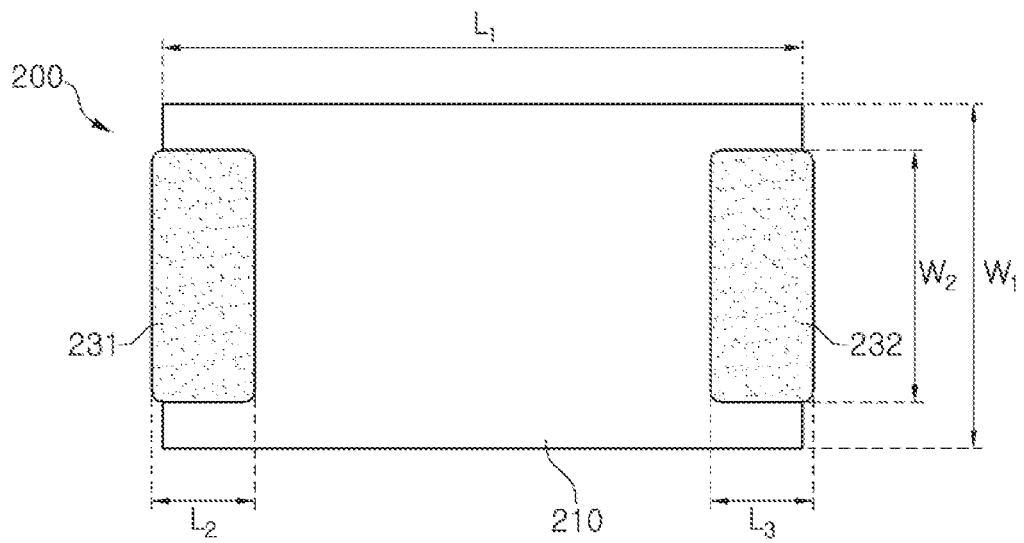
FIG. 4 is a top plan view of a ceramic chip of the composite electronic component of FIG. 1.

FIG. 4 is a top plan view of a ceramic chip of the composite electronic component of FIG. 1.

In the composite electronic component according to an exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' refers to a direction in which dielectric layers of a multilayer ceramic capacitor are stacked, that is, a 'stack direction'.

Meanwhile, in an exemplary embodiment in the present disclosure, the composite electronic component may have upper and lower surfaces opposing each other, and first and second end surfaces connecting the upper and lower surfaces to each other and opposing each other in the length direction and first and second side surfaces connecting the upper and lower surfaces to each other and opposing each other in the width direction. A shape of the composite electronic component is not particularly limited, and may be a hexahedral shape as illustrated.

In addition, the first and second end surfaces of the composite electronic component in the length direction and the first and second side surfaces thereof in the width direction may be the same as first and second end surfaces of a multilayer ceramic capacitor and a ceramic chip in the length direction and first and second side surfaces thereof in the width direction, respectively, as described below.

Meanwhile, the composite electronic component may have a form in which the multilayer ceramic capacitor and the ceramic chip are coupled to each other, and when the ceramic chip is coupled to a lower portion of the multilayer ceramic capacitor, an upper surface of the composite electronic component may refer to an upper surface of the multilayer ceramic capacitor, and a lower surface of the composite electronic component may refer to a lower surface of the ceramic chip.

Referring to FIGS. 1 and 2, the composite electronic component according to an exemplary embodiment in the present disclosure may include a composite body 300 formed by coupling a multilayer ceramic capacitor 100 and a ceramic chip 200 to each other, the multilayer ceramic capacitor 100 including a first ceramic body 110 in which a plurality of dielectric layers and internal electrodes 121 and 122 disposed to face each other with each of the dielectric layers are stacked and first and second external electrodes 131 and 132 disposed on opposite end portions of the first ceramic body 110, respectively, and the ceramic chip 200 being disposed below the multilayer ceramic capacitor 100 and including a second ceramic body 210 including ceramic and first and second terminal electrodes 231 and 232 disposed on opposite end portions of the second ceramic body 210, respectively, and connected to the first and second external electrodes 131 and 132, respectively.

The ceramic may include alumina ($Al_2O_3$).

Generally, there has been an attempt to insert an intermediate medium between a multilayer ceramic capacitor and a printed circuit board in order to significantly suppress vibrations of the multilayer ceramic capacitor from being transferred to the printed circuit board.

However, the intermediate medium, which is generally a resin used to manufacture the printed circuit board, is formed of a material having elasticity, and thus serves to absorb the vibrations of the multilayer ceramic capacitor by its elasticity.

On the other hand, according to an exemplary embodiment in the present disclosure, since the second ceramic body 210 of the ceramic chip 200 is formed of only ceramic including hard alumina ($Al_2O_3$) that is not elastically deformed, the printed circuit board and the multilayer ceramic capacitor 100 may be spaced apart from each other by the ceramic chip 200. Therefore, the transfer of vibrations themselves generated from the multilayer ceramic capacitor 100 may be blocked.

According to an exemplary embodiment in the present disclosure, a ratio ($L_1/L_0$) of a length $L_1$ of the ceramic chip 200 to a length $L_0$ of the multilayer ceramic capacitor 100 may be 0.7 to 1.0, and a ratio (($L_2+L_3$)/$L_1$) of the sum of a length $L_2$ of the first terminal electrode 231 and a length $L_3$ of the second terminal electrode 232 to the length $L_1$ of the ceramic chip 200 may be 0.3 to 0.6.

Conventionally, a composite electronic component in which a board is used on a lower surface of the multilayer ceramic capacitor in order to decrease the acoustic noise has been studied.

However, detailed research into a removal level of the acoustic noise depending on a size of the multilayer ceramic capacitor, a manner of mounting the multilayer ceramic capacitor, a size of a ceramic chip disposed below the multilayer ceramic capacitor, and a size of an electrode disposed on the ceramic chip is insufficient. Therefore, research for searching critical points depending on the size of the multilayer ceramic capacitor, the manner of mounting the multilayer ceramic capacitor, the size of the ceramic chip disposed below the multilayer ceramic capacitor, and the size of the electrode disposed on the ceramic chip, and an influence level of the acoustic noise has been required, and according to an exemplary embodiment in the present disclosure, numerical values for various parameters are provided.

In detail, according to an exemplary embodiment in the present disclosure, the ratio ($L_1/L_0$) of the length $L_1$ of the ceramic chip 200 to the length $L_0$ of the multilayer ceramic capacitor 100 may be controlled to be in a range from about 0.7 to about 1.0, and the ratio (($L_2+L_3$)/$L_1$) of the sum of the length $L_2$ of the first terminal electrode 231 and the length $L_3$ of the second terminal electrode 232 to the length $L_1$ of the ceramic chip 200 may be controlled to be in a range from about 0.3 to about 0.6, such that acoustic noise may be significantly decreased. It should be noted that as used herein, the term "about" refers to variation in a given value or parameter because of manufacturing or measurement tolerances.

Generally, when lengths of the first and second terminal electrodes of the ceramic chip are large, a bonding area between the multilayer ceramic capacitor and the ceramic chip may be increased, such that an adhesion strength between the multilayer ceramic capacitor and the ceramic chip may be increased, but the vibrations generated from the multilayer ceramic capacitor may be better transferred to the ceramic chip, such that acoustic noise may be increased.

According to an exemplary embodiment in the present disclosure, the ratio ($L_1/L_0$) of the length $L_1$ of the ceramic chip 200 to the length $L_0$ of the multilayer ceramic capacitor 100 may be controlled to be in a range from about 0.7 to about 1.0, and the ratio (($L_2+L_3$)/$L_1$) of the sum of the length $L_2$ of the first terminal electrode 231 and the length $L_3$ of the second terminal electrode 232 to the length $L_1$ of the ceramic chip 200 may be controlled to be in a range from about 0.3 to about 0.6, such that an influence of the acoustic noise generated from the multilayer ceramic capacitor 100 may be significantly decreased, and a decrease in the adhesion strength between the multilayer ceramic capacitor and the ceramic chip may be prevented.

When the ratio (($L_2+L_3$)/$L_1$) of the sum of the length $L_2$ of the first terminal electrode 231 and the length $L_3$ of the second terminal electrode 232 to the length $L_1$ of the ceramic chip 200 is less than about 0.3, the lengths of the first and second terminal electrodes of the ceramic chip 200 may be excessively short, such that the bonding area between the multilayer ceramic capacitor and the ceramic chip may be decreased, and the adhesion strength between the multilayer ceramic capacitor and the ceramic chip may thus be decreased.

Meanwhile, when the ratio (($L_2+L_3$)/$L_1$) of the sum of the length $L_2$ of the first terminal electrode 231 and the length $L_3$ of the second terminal electrode 232 to the length $L_1$ of the ceramic chip 200 exceeds about 0.6, an acoustic noise decrease effect may be insufficient.

The ratio ($L_1/L_0$) of the length $L_1$ of the ceramic chip 200 to the length $L_0$ of the multilayer ceramic capacitor 100 may be in a range from about 0.7 to about 1.0. Preferably, the ratio ($L_1/L_0$) of the length $L_1$ of the ceramic chip 200 to the length $L_0$ of the multilayer ceramic capacitor 100 may be in a range from about 0.8 to about 0.9.

The ratio ($L_1/L_0$) of the length $L_1$ of the ceramic chip 200 to the length $L_0$ of the multilayer ceramic capacitor 100 may be in a range from about 0.7 to about 1.0. Particularly, the ratio ($L_1/L_0$) of the length $L_1$ of the ceramic chip 200 to the length $L_0$ of the multilayer ceramic capacitor 100 may be in a range from about 0.8 to about 0.9, such that the influence of the acoustic noise generated from the multilayer ceramic capacitor 100 may be significantly decreased, and the decrease in the adhesion strength between the multilayer ceramic capacitor and the ceramic chip may be prevented.

When the ratio ($L_1/L_0$) of the length $L_1$ of the ceramic chip 200 to the length $L_0$ of the multilayer ceramic capacitor 100 is less than about 0.8, the length of the ceramic chip may be excessively small, such that the bonding area between the multilayer ceramic capacitor and the ceramic chip may be decreased, and the adhesion strength between the multilayer ceramic capacitor and the ceramic chip may thus be decreased.

Meanwhile, when the ratio ($L_1/L_0$) of the length $L_1$ of the ceramic chip 200 to the length $L_0$ of the multilayer ceramic capacitor 100 exceeds about 1.0, the acoustic noise decrease effect may be insufficient.

However, it may be preferable that the ratio ($L_1/L_0$) of the length $L_1$ of the ceramic chip 200 to the length $L_0$ of the multilayer ceramic capacitor 100 does not exceed about 0.9 in order to obtain the acoustic noise decrease effect and an adhesion strength improvement effect between the multilayer ceramic capacitor and the ceramic chip.

In an exemplary embodiment in the present disclosure, the ratio (($L_2+L_3$)/$L_1$) of the sum of the length $L_2$ of the first terminal electrode 231 and the length $L_3$ of the second terminal electrode 232 to the length $L_1$ of the ceramic chip 200 may be in a range from about 0.3 to about 0.6. Preferably, the ratio (($L_2+L_3$)/$L_1$) of the sum of the length $L_2$ of the first terminal electrode 231 and the length $L_3$ of the second terminal electrode 232 to the length $L_1$ of the ceramic chip 200 may be in a range from about 0.4 to about 0.5.

It may be sufficient that the ratio $((L_2+L_3)/L_1)$ of the sum of the length $L_2$ of the first terminal electrode 231 and the length $L_3$ of the second terminal electrode 232 to the length $L_1$ of the ceramic chip 200 for decreasing the acoustic noise and improving the adhesion strength is in a range from about 0.3 to about 0.6, but when the ratio $((L_2+L_3)/L_1)$ of the sum of the length $L_2$ of the first terminal electrode 231 and the length $L_3$ of the second terminal electrode 232 to the length $L_1$ of the ceramic chip 200 is in a range from about 0.4 to about 0.5, the acoustic noise decrease effect may be more excellent, and the adhesion strength improvement effect between the multilayer ceramic capacitor and the ceramic chip may also be more excellent.

According to an exemplary embodiment in the present disclosure, a ratio $(W_1/W_0)$ of a width $W_1$ of the ceramic chip to a width $W_0$ of the multilayer ceramic capacitor may be in a range from about 0.7 to about 1.0, and a ratio $(W_2/W_1)$ of a width $W_2$ of each of the first and second terminal electrodes to the width $W_1$ of the ceramic chip may be in a range from about 0.7 to about 1.0.

The ratio $(W_1/W_0)$ of the width $W_1$ of the ceramic chip to the width $W_0$ of the multilayer ceramic capacitor may be controlled to be in a range from about 0.7 to about 1.0, and the ratio $(W_2/W_1)$ of the width $W_2$ of each of the first and second terminal electrodes to the width $W_1$ of the ceramic chip may be controlled to be in a range from about 0.7 to about 1.0, such that the influence of the acoustic noise generated from the multilayer ceramic capacitor 100 may be significantly decreased, and the decrease in the adhesion strength between the multilayer ceramic capacitor and the ceramic chip may be prevented.

When the ratio $(W_2/W_1)$ of the width $W_2$ of each of the first and second terminal electrodes to the width $W_1$ of the ceramic chip is less than about 0.7, the width of each of the first and second terminal electrodes may be excessively small, such that a bonding area between the multilayer ceramic capacitor and the ceramic chip may be decreased, and an adhesion strength between the multilayer ceramic capacitor and the ceramic chip may thus be decreased.

Meanwhile, when the ratio $(W_2/W_1)$ of the width $W_2$ of each of the first and second terminal electrodes to the width $W_1$ of the ceramic chip exceeds about 1.0, an acoustic noise decrease effect may be insufficient.

The ratio $(W_1/W_0)$ of the width $W_1$ of the ceramic chip to the width $W_0$ of the multilayer ceramic capacitor may be in a range from about 0.7 to about 1.0. Preferably, the ratio $(W_1/W_0)$ of the width $W_1$ of the ceramic chip to the width $W_0$ of the multilayer ceramic capacitor may be in a range from about 0.8 to about 1.0.

The ratio $(W_1/W_0)$ of the width $W_1$ of the ceramic chip to the width $W_0$ of the multilayer ceramic capacitor may be in a range from about 0.7 to about 1.0. Particularly, the ratio $(W_1/W_0)$ of the width $W_1$ of the ceramic chip to the width $W_0$ of the multilayer ceramic capacitor may be in a range from about 0.8 to about 1.0, such that the influence of the acoustic noise generated from the multilayer ceramic capacitor 100 may be significantly decreased, and the decrease in the adhesion strength between the multilayer ceramic capacitor and the ceramic chip may be prevented.

When the ratio $(W_1/W_0)$ of the width $W_1$ of the ceramic chip to the width $W_0$ of the multilayer ceramic capacitor is less than about 0.7, the width of the ceramic chip may be excessively small, such that a bonding area between the multilayer ceramic capacitor and the ceramic chip may be decreased, and an adhesion strength between the multilayer ceramic capacitor and the ceramic chip may thus be decreased.

Meanwhile, when the ratio $(W_1/W_0)$ of the width $W_1$ of the ceramic chip to the width $W_0$ of the multilayer ceramic capacitor exceeds about 1.0, an acoustic noise decrease effect may be insufficient.

However, it may not be preferable that the ratio $(W_1/W_0)$ of the width $W_1$ of the ceramic chip to the width $W_0$ of the multilayer ceramic capacitor is controlled to be less than about 0.8 in order to obtain the acoustic noise decrease effect and the adhesion strength improvement effect between the multilayer ceramic capacitor and the ceramic chip.

In an exemplary embodiment in the present disclosure, the ratio $(W_2/W_1)$ of the width $W_2$ of each of the first and second terminal electrodes to the width $W_1$ of the ceramic chip may be in a range from about 0.7 to about 1.0. Preferably, the ratio $(W_2/W_1)$ of the width $W_2$ of each of the first and second terminal electrodes to the width $W_1$ of the ceramic chip may be in a range from about 0.8 to about 0.9.

It may be sufficient that the ratio $(W_2/W_1)$ of the width $W_2$ of each of the first and second terminal electrodes to the width $W_1$ of the ceramic chip for decreasing the acoustic noise and improving the adhesion strength is in a range from about 0.7 to about 1.0, but when the ratio $(W_2/W_1)$ of the width $W_2$ of each of the first and second terminal electrodes to the width $W_1$ of the ceramic chip is in a range from about 0.8 to about 0.9, the acoustic noise decrease effect may be more excellent, and the adhesion strength improvement effect between the multilayer ceramic capacitor and the ceramic chip may also be more excellent.

The multilayer ceramic capacitor 100 and the ceramic chip 200 constituting the composite body 300 will hereinafter be described in detail.

Referring to FIG. 2, the first ceramic body 110 constituting the multilayer ceramic capacitor 100 may be formed by stacking the plurality of dielectric layers 111, and a plurality of internal electrodes 121 and 122 (first and second internal electrodes) may be arranged in the first ceramic body 110 to be spaced apart from each other with each of the dielectric layers 111 interposed therebetween.

The plurality of dielectric layers 111 forming the first ceramic body 110 may be in a sintered state, and adjacent dielectric layers may be integrated with each other so that boundaries therebetween are not readily apparent.

The dielectric layer 111 may be formed by sintering a ceramic green sheet including ceramic powders, an organic solvent, and an organic binder. The ceramic powder, which is a material having a high dielectric constant, may be a barium titanate ($BaTiO_3$) based material, a strontium titanate ($SrTiO_3$) based material, or the like, but is not limited thereto.

That is, the dielectric layers 111 constituting the first ceramic body 110 may include a ferroelectric material, but are not necessarily limited thereto.

Meanwhile, according to an exemplary embodiment in the present disclosure, the internal electrodes may include first internal electrodes 121 exposed to the first end surface of the composite body 300 in the length direction and second internal electrodes 122 exposed to the second end surface thereof in the length direction, but are not necessarily limited thereto.

The first and second internal electrodes 121 and 122 may be formed of a conductive paste including a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layers 111, using a conductive paste by a printing method such as a screen printing method or a gravure printing method.

The ceramic green sheets on which the internal electrodes are printed may be stacked and sintered to form the first ceramic body 110.

The plurality of first and second internal electrodes 121 and 122 may be disposed to be horizontal to upper and lower surfaces of the first ceramic body 110.

Meanwhile, the first and second external electrodes 131 and 132 may be formed of a conductive paste including a conductive metal. Here, the conductive metal may be nickel (Ni), copper (Cu), palladium (Pd), gold (Au), or alloys thereof, but is not limited thereto.

In addition, nickel/tin (Ni/Sn) plating layers may further be disposed on the first and second external electrodes 131 and 132.

In an exemplary embodiment in the present disclosure, the multilayer ceramic capacitor 100 may have a size of a 0804 size (length×width: 0.8 mm×0.4 mm) or less.

That is, in the composite electronic component according to an exemplary embodiment in the present disclosure, the multilayer ceramic capacitor may be used in a small product having a size of the 0804 size (length×width: 0.8 mm×0.4 mm) or less.

In addition, in an exemplary embodiment in the present disclosure, the multilayer ceramic capacitor 100 may have a thickness of 0.7 mm or less.

In an exemplary embodiment in the present disclosure, as the size of the multilayer ceramic capacitor 100 is decreased as described above, a size of the ceramic chip 200 may also be decreased, but since it is difficult to decrease a size of each of the first and second terminal electrodes 231 and 232 disposed on the ceramic chip 200 due to a limitation in a process, ratios between the size of the multilayer ceramic capacitor and sizes of the ceramic chip and each of the terminal electrodes disposed on the ceramic chip may be optimized to significantly increase an acoustic noise decrease effect and improve an adhesion strength between the multilayer ceramic capacitor and the ceramic chip.

According to an exemplary embodiment in the present disclosure, the ceramic chip may be coupled to the lower surface of the multilayer ceramic capacitor 100 and be disposed below the multilayer ceramic capacitor 100.

The ceramic chip 200 may have a shape in which the first and second terminal electrodes 231 and 232 connected to the first and second external electrodes 131 and 132, respectively, are disposed, respectively, on the opposite end portions of the ceramic body 210 formed of ceramic having a bulk form.

Generally, there has been an attempt to insert an intermediate medium between a multilayer ceramic capacitor and a printed circuit board in order to significantly suppress vibrations of the multilayer ceramic capacitor from being transferred to the printed circuit board.

However, the intermediate medium, which is generally a resin used to manufacture the printed circuit board, is formed of a material having elasticity, and thus serves to transfer the vibrations of the multilayer ceramic capacitor by its elasticity.

On the other hand, according to an exemplary embodiment in the present disclosure, since the second ceramic body 210 of the ceramic chip 200 is formed of only ceramic including a hard material that is not elastically deformed, the printed circuit board and the multilayer ceramic capacitor 100 may be spaced apart from each other by the ceramic chip 200. Therefore, the transfer of vibrations themselves generated from the multilayer ceramic capacitor 100 may be blocked.

According to an exemplary embodiment in the present disclosure, the ceramic may include alumina ($Al_2O_3$).

Since alumina ($Al_2O_3$) does not have piezoelectric characteristics, alumina ($Al_2O_3$) may suppress the transfer of vibrations themselves generated from the multilayer ceramic capacitor 100. Therefore, the ceramic chip 200 including alumina ($Al_2O_3$) may be disposed below the multilayer ceramic capacitor 100 to decrease the acoustic noise.

The first and second terminal electrodes 231 and 232 may have, for example, double layer structures including first and second conductive resin layers disposed at an inner side and first and second plating layers disposed at an outer side, respectively, but are not particularly limited thereto.

According to an exemplary embodiment in the present disclosure, since the first and second terminal electrodes 231 and 232 have the double layer structures including the first and second conductive resin layers disposed at the inner side and the first and second plating layers disposed at the outer side, respectively, when mechanical stress is applied from an external source, the transfer of the stress to the multilayer ceramic capacitor 100 may be suppressed by the ceramic chip 200 and the conductive resin layers used as the terminal electrodes 231 and 232 of the ceramic chip 200, such that damage due to a crack of the multilayer ceramic capacitor may be prevented.

Each of the first and second conductive resin layers may include a conductive metal and a thermosetting resin, and may include, for example, silver (Ag) and an epoxy resin, but is not limited thereto.

Figure 5:
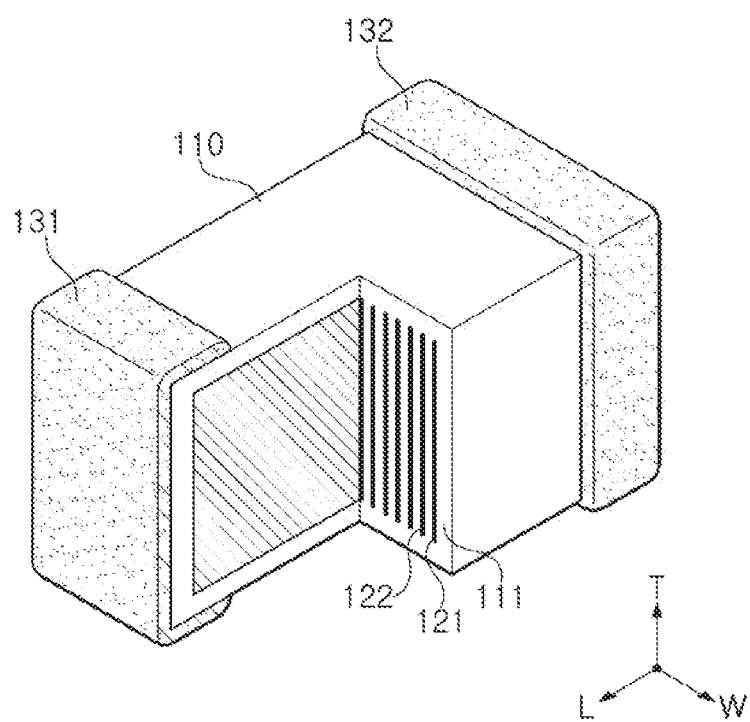
FIG. 5 is a partially cut-away schematic perspective view illustrating a multilayer ceramic capacitor according to another exemplary embodiment in the composite electronic component of FIG. 1.

FIG. 5 is a partially cut-away schematic perspective view illustrating a multilayer ceramic capacitor according to another exemplary embodiment in the composite electronic component of FIG. 1.

In the multilayer ceramic capacitor according to another exemplary embodiment in the present disclosure, the plurality of first and second internal electrodes 121 and 122 may be disposed perpendicular to the upper and lower surfaces of the first ceramic body 110.

That is, the first and second internal electrodes 121 and 122 may be stacked perpendicular to a mounting surface at the time of mounting the composite body 300 on the printed circuit board.

Generally, when a voltage is applied to the multilayer ceramic capacitor, the ceramic body may be repeatedly expanded and contracted in the width and thickness directions by an inverse piezoelectric effect of the dielectric layers.

That is, when displacement amounts of a length-width surface (an LW surface), a width-thickness surface (a WT surface), and a length-thickness surface (an LT surface) of the ceramic body are measured by a laser Doppler vibrometer (LDV), the displacement amounts may appear in a sequence of LW surface >WT surface >LT surface.

The displacement amount of the LT surface, which is about 42% of that of the WT surface, may be smaller than that of the WT surface. Therefore, even when stress having the same magnitude is generated in the LT surface and the WT surface, because the LT surface has an area relatively greater than that of the WT surface, stress having a similar magnitude is distributed over a wide area of the LT surface, such that relatively small deformation is generated in the LT surface.

Therefore, it may be seen that the displacement amount of the LT surface in a general multilayer ceramic capacitor is the smallest.

That is, according to an exemplary embodiment in the present disclosure, the first and second internal electrodes 121 and 122 may be stacked perpendicular to the upper and lower surfaces of the first ceramic body 110, such that the first and second internal electrodes 121 and 122 may be disposed perpendicular to the mounting surface at the time of mounting the composite body on the printed circuit board, and a vibration amount of a surface in contact with the ceramic chip 200 may be significantly decreased.

Figure 6:
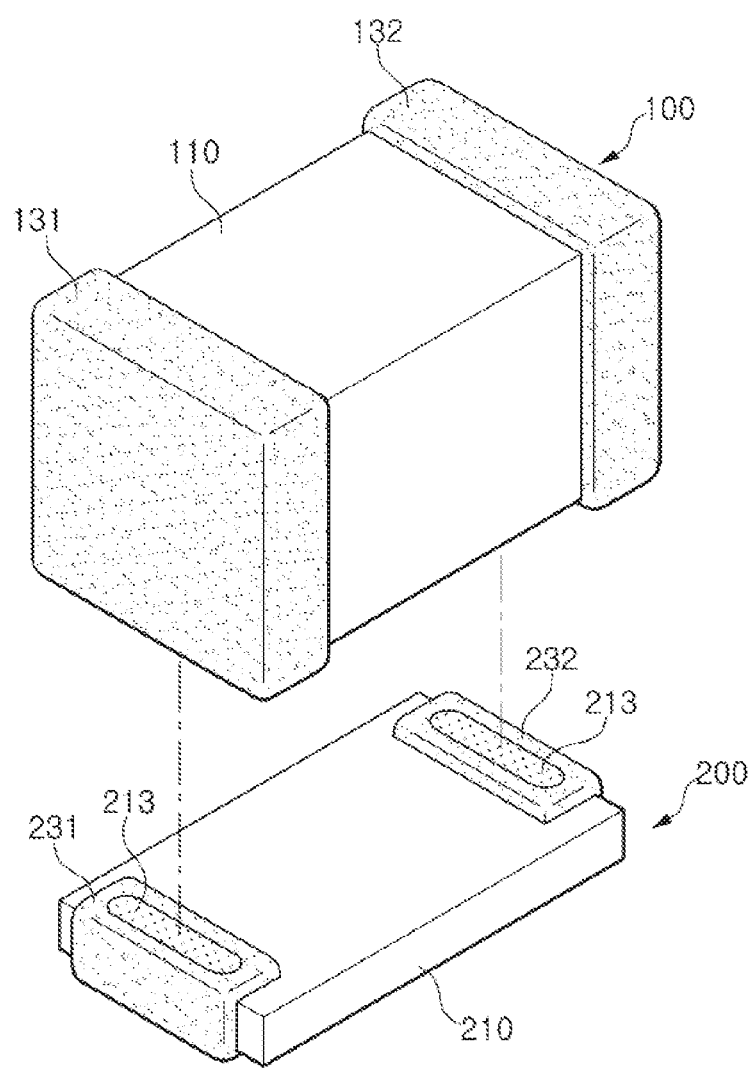
FIG. 6 is an exploded perspective view illustrating the multilayer ceramic capacitor and the ceramic chip of the composite electronic component of FIG. 1.

FIG. 6 is an exploded perspective view illustrating the multilayer ceramic capacitor and the ceramic chip of the composite electronic component of FIG. 1.

The composite body 300 may be formed by coupling the multilayer ceramic capacitor 100 and the ceramic chip 200 to each other. However, a method of forming the composite body 300 is not particularly limited.

The composite body 300 may be formed by coupling the multilayer ceramic capacitor 100 and the ceramic chip 200 that are separately manufactured to each other by high melting point solders, conductive adhesives 213, or the like.

The conductive adhesive 213 may have a paste form including a conductive metal and an epoxy resin, but is not necessarily limited thereto.

Referring to FIG. 6, when the multilayer ceramic capacitor 100 and the ceramic chip 200 are coupled to each other through the high melting point solders, the conductive adhesives 213, or the like, the conductive adhesives 213 may be applied to upper surfaces of the first and second terminal electrodes 231 and 232 to bond the first and second terminal electrodes 231 and 232 and the first and second external electrodes 131 and 132 of the multilayer ceramic capacitor 100, respectively.

The high melting point solders or the conductive adhesives 213 may be applied to the upper surfaces of the first and second terminal electrodes 231 and 232 to fix the ceramic chip 200 and the multilayer ceramic capacitor 100 to each other and thus allow only vibrations of a length-width surface (a LW surface) of the first ceramic body 110 to be transferred to the ceramic chip 200.

Therefore, stress and vibrations generated from the multilayer ceramic capacitor may be significantly suppressed from being transferred to the ceramic chip, such that the acoustic noise may be decreased.

The present disclosure will hereinafter be described in detail with reference to Inventive Examples, but is not limited thereto.

Experimental Example

Composite electronic components according to Inventive Examples and Comparative Examples were manufactured as follows.

The composite electronic components according to Inventive Examples and Comparative Examples were manufactured so that ceramic chips are disposed below multilayer ceramic capacitors and were manufactured depending on lengths of the multilayer ceramic capacitors and mounted forms of internal electrodes of the multilayer ceramic capacitors, and adhesion strengths between the multilayer ceramic capacitors and the ceramic chips and acoustic noise values depending on the ratio ($L_1/L_0$) of the length $L_1$ of the ceramic chip 200 to the length $L_0$ of the multilayer ceramic capacitor 100, the ratio (($L_2+L_3$)/$L_1$) of the sum of the length $L_2$ of the first terminal electrode 231 and the length $L_3$ of the second terminal electrode 232 to the length $L_1$ of the ceramic chip 200, the ratio ($W_1/W_0$) of the width $W_1$ of the ceramic chip to the width $W_0$ of the multilayer ceramic capacitor, and the ratio ($W_2/W_1$) of the width $W_2$ of each of the first and second terminal electrodes to the width $W_1$ of the ceramic chip were compared with one another.

In detail, Table 1 illustrates a case in which the internal electrodes are stacked to be horizontal to a mounting surface of a board, and is a table for comparing adhesion strengths between the multilayer ceramic capacitors and the ceramic chips and acoustic noise values depending on the ratio ($L_1/L_0$) of the length $L_1$ of the ceramic chip 200 to the length $L_0$ of the multilayer ceramic capacitor 100 and the ratio (($L_2+L_3$)/$L_1$) of the sum of the length $L_2$ of the first terminal electrode 231 and the length $L_3$ of the second terminal electrode 232 to the length $L_1$ of the ceramic chip 200 with one another.

TABLE 1

|  | $L_1/L_0$ | ($L_2 + L_3$)/$L_1$ | Adhesion Strength (N) | Acoustic noise (dBA) |
|---|---|---|---|---|
| 1 | 1.0 | 0.30 | 21 | 31 |
| 2 | 1.0 | 0.40 | 23 | 32 |
| 3 | 1.0 | 0.50 | 24 | 35 |
| 4 | 1.0 | 0.60 | 24 | 34 |
| 5 | 0.9 | 0.30 | 17 | 29 |
| 6 | 0.9 | 0.40 | 18 | 28 |
| 7 | 0.9 | 0.50 | 19 | 30 |
| 8 | 0.9 | 0.60 | 19 | 30 |
| 9 | 0.8 | 0.30 | 16 | 26 |
| 10 | 0.8 | 0.40 | 17 | 26 |
| 11 | 0.8 | 0.50 | 18 | 28 |
| 12 | 0.8 | 0.60 | 18 | 30 |
| *13 | 0.7 | 0.30 | 12 | 27 |
| *14 | 0.7 | 0.40 | 13 | 28 |
| *15 | 0.7 | 0.50 | 13 | 29 |
| *16 | 0.7 | 0.60 | 13 | 29 |

*Comparative Example

Referring to Table 1, it may be seen that in Comparative Examples 13 to 16, cases in which the ratio ($L_1/L_0$) of the length $L_1$ of the ceramic chip 200 to the length $L_0$ of the multilayer ceramic capacitor 100 is 0.7, acoustic noise values are small, but adhesion strengths between the multilayer ceramic capacitors and the ceramic chips are small.

On the other hand, it may be seen that in Inventive Examples in which the ratio ($L_1/L_0$) of the length $L_1$ of the ceramic chip 200 to the length $L_0$ of the multilayer ceramic capacitor 100 is 0.8 to 0.9 and the ratio (($L_2+L_3$)/$L_1$) of the sum of the length $L_2$ of the first terminal electrode 231 and the length $L_3$ of the second terminal electrode 232 to the length $L_1$ of the ceramic chip 200 is 0.4 to 0.5, acoustic noise values are small, and adhesion strengths between the multilayer ceramic capacitors and the ceramic chips are high.

In Table 1, a case in which an adhesion strength exceeds 15N or an acoustic noise is 30 dB or less was evaluated to be Inventive Example, but a case in which an adhesion strength exceeds 15N and acoustic noise is 30 dB or less was preferable Inventive Example.

Table 2 is a table for comparing adhesion strengths between the multilayer ceramic capacitors and the ceramic chips and acoustic noise values depending on the ratio ($W_1/W_0$) of the width $W_1$ of the ceramic chip to the width $W_0$ of the multilayer ceramic capacitor and the ratio ($W_2/W_1$) of the width $W_2$ of each of the first and second terminal electrodes to the width $W_1$ of the ceramic chip.

TABLE 2

| | $W_1/W_0$ | $W_2/W_1$ | Adhesion Strength (N) | Acoustic noise (dBA) |
|---|---|---|---|---|
| 1 | 1.0 | 1.0 | 23 | 32 |
| 2 | 1.0 | 0.9 | 23 | 30 |
| 3 | 1.0 | 0.8 | 20 | 29 |
| 4 | 1.0 | 0.7 | 17 | 29 |
| 5 | 0.9 | 1.0 | 21 | 30 |
| 6 | 0.9 | 0.9 | 21 | 26 |
| 7 | 0.9 | 0.8 | 18 | 27 |
| 8 | 0.9 | 0.7 | 15 | 29 |
| 9 | 0.8 | 1.0 | 18 | 29 |
| 10 | 0.8 | 0.9 | 18 | 26 |
| 11 | 0.8 | 0.8 | 16 | 27 |
| 12 | 0.8 | 0.7 | 14 | 28 |
| *13 | 0.7 | 1.0 | 15 | 29 |
| *14 | 0.7 | 0.9 | 15 | 28 |
| *15 | 0.7 | 0.8 | 12 | 29 |
| *16 | 0.7 | 0.7 | 13 | 28 |

*Comparative Example

Referring to Table 2, it may be seen that in Comparative Examples 13 to 16, cases in which the ratio ($W_1/W_0$) of the width $W_1$ of the ceramic chip to the width $W_0$ of the multilayer ceramic capacitor is 0.7, acoustic noise values are small, but adhesion strengths between the multilayer ceramic capacitors and the ceramic chips are small.

On the other hand, it may be seen that in Inventive Examples in which the ratio ($W_1/W_0$) of the width $W_1$ of the ceramic chip to the width $W_0$ of the multilayer ceramic capacitor is 0.8 to 1.0 and the ratio ($W_2/W_1$) of the width $W_2$ of each of the first and second terminal electrodes to the width $W_1$ of the ceramic chip is 0.8 to 0.9, acoustic noise values are small, and adhesion strengths between the multilayer ceramic capacitors and the ceramic chips are high.

In Table 2, a case in which an adhesion strength exceeds 15N or acoustic noise is 30 dB or less was evaluated to be Inventive Example, but a case in which an adhesion strength exceeds 15N and acoustic noise is 30 dB or less was preferable Inventive Example.

As set forth above, according to an exemplary embodiment in the present disclosure, stress or vibrations depending on piezoelectric characteristics of the multilayer ceramic capacitor may be alleviated by the ceramic chip, such that acoustic noise generated from the circuit board may be decreased.

Particularly, ratios between the size of the multilayer ceramic capacitor and the sizes of the ceramic chip and each of the terminal electrodes disposed on the ceramic chip may be optimized to significantly increase an acoustic noise decrease effect and improve an adhesion strength between the multilayer ceramic capacitor and the ceramic chip.

In addition, the internal electrodes of the multilayer ceramic capacitor may be stacked in a direction perpendicular to the mounting surface, and a surface of the multilayer ceramic capacitor in a length-width direction of which a piezoelectric displacement amount is small may be bonded to the ceramic chip to significantly suppress the stress and the vibrations generated from the multilayer ceramic capacitor from being transferred to the ceramic chip, such that the acoustic noise may be decreased.

While exemplary embodiments have been shown and described above, it will be apparent to those skilled in the art that modifications and variations could be made without departing from the scope of the present invention as defined by the appended claims.

What is claimed is:

1. A composite electronic component comprising:
a composite body comprising a multilayer ceramic capacitor coupled to a ceramic chip, the multilayer ceramic capacitor including a first ceramic body in which a plurality of dielectric layers and internal electrodes disposed to face each other with each of the dielectric layers interposed therebetween are stacked and first and second external electrodes disposed on opposite end portions of the first ceramic body in a length direction, respectively, and the ceramic chip being disposed below the multilayer ceramic capacitor and including a second ceramic body and first and second terminal electrodes disposed on opposite end portions of the second ceramic body, respectively in the length direction, and connected to the first and second external electrodes, respectively,
wherein the multilayer ceramic capacitor and the ceramic chip are coupled to each other by a conductive adhesive comprising a conductive metal and an epoxy resin, the conductive adhesive being disposed only between upper surfaces of the first and second terminal electrodes and lower surfaces of the first and second external electrodes respectively,
a ratio of a length of the ceramic chip to a length of the multilayer ceramic capacitor is in a range from 0.7 to 1.0,
a maximum width of each of the first and second terminals is smaller than a width of the second ceramic body,
the maximum width of each of the first and second terminals disposed on upper, lower and corresponding end surfaces of the second ceramic body is substantially the same, and
a ratio of a sum of a length of the first terminal electrode and a length of the second terminal electrode to the length of the ceramic chip is in a range from 0.3 to 0.6.

2. The composite electronic component of claim 1, wherein the ratio of the length of the ceramic chip to the length of the multilayer ceramic capacitor is in a range from 0.8 to 0.9.

3. The composite electronic component of claim 1, wherein the ratio of the sum of the length of the first terminal electrode and the length of the second terminal electrode to the length of the ceramic chip is in a range from 0.4 to 0.5.

4. The composite electronic component of claim 1, wherein a ratio of a width of the ceramic chip to a width of the multilayer ceramic capacitor is in a range from 0.7 to 1.0, and
a ratio of the maximum width of each of the first and second terminal electrodes to the width of the ceramic chip is greater than or equal to 0.7.

5. The composite electronic component of claim 4, wherein the ratio of the width of the ceramic chip to the width of the multilayer ceramic capacitor is in a range from 0.8 to 1.0.

6. The composite electronic component of claim 4, wherein the ratio of the maximum width of each of the first and second terminal electrodes to the width of the ceramic chip is in a range from 0.8 to 0.9.

7. The composite electronic component of claim 1, wherein the internal electrodes in the first ceramic body are stacked perpendicular to a mounting surface of the composite body.

8. The composite electronic component of claim 1, wherein the multilayer ceramic capacitor has a size of a 0804 size (length×width: 0.8 mm×0.4 mm) or less, and has a thickness of 0.7 mm or less.

9. A composite electronic component comprising:
a composite body comprising a multilayer ceramic capacitor coupled to a ceramic chip, the multilayer ceramic capacitor including a first ceramic body in which a plurality of dielectric layers and internal electrodes disposed to face each other with each of the dielectric layers interposed therebetween are stacked and first and second external electrodes disposed on opposite end portions of the first ceramic body in a length direction, respectively, and the ceramic chip being disposed below the multilayer ceramic capacitor and including a second ceramic body and first and second terminal electrodes disposed on opposite end portions of the second ceramic body in the length direction, respectively, and connected to the first and second external electrodes, respectively,
wherein the multilayer ceramic capacitor and the ceramic chip are coupled to each other by a conductive adhesive comprising a conductive metal and an epoxy resin, the conductive adhesive being disposed only between upper surfaces of the first and second terminal electrodes and lower surfaces of the first and second external electrodes respectively,
a ratio of a width of the ceramic chip to a width of the multilayer ceramic capacitor is in a range from 0.7 to 1.0,
a width of each of the first and second terminals is smaller than a width of the second ceramic body,
the width of each of the first and second terminals disposed on upper, lower and corresponding end surfaces of the second ceramic body is substantially the same, and
a ratio of a width of each of the first and second terminal electrodes to the width of the ceramic chip is greater than or equal to 0.7.

10. The composite electronic component of claim 9, wherein the ratio of the width of the ceramic chip to the width of the multilayer ceramic capacitor is in a range from 0.8 to 1.0.

11. The composite electronic component of claim 9, wherein the ratio of the width of each of the first and second terminal electrodes to the width of the ceramic chip is in a range from 0.8 to 0.9.

12. The composite electronic component of claim 9, wherein the internal electrodes in the first ceramic body are stacked perpendicular to a mounting surface of the composite body.

13. The composite electronic component of claim 9, wherein the multilayer ceramic capacitor and the ceramic chip are coupled to each other by conductive adhesives applied to upper surfaces of the first and second terminal electrodes.

14. The composite electronic component of claim 9, wherein the multilayer ceramic capacitor has a size of a 0804 size (length×width: 0.8 mm×0.4 mm) or less, and has a thickness of 0.7 mm or less.

15. A composite electronic component comprising:
a multilayer ceramic capacitor including first internal electrodes connected to a first external electrode and second internal electrodes connected to a second external electrode, the first and second internal electrodes being alternately disposed with dielectric layers interposed therebetween, the dielectric layers forming a first ceramic body such that the first and second external electrodes are disposed on opposite end portions of the first ceramic body in a length direction; and
a ceramic chip disposed below the multilayer ceramic capacitor in a thickness direction, the ceramic chip comprising a second ceramic body and first and second terminal electrodes disposed on opposite ends of the second ceramic body in the length direction, the ceramic chip having a length and a width smaller than those of the first ceramic body,
wherein the multilayer ceramic capacitor and the ceramic chip are coupled to each other by a conductive adhesive comprising a conductive metal and an epoxy resin, the conductive adhesive being disposed only between upper surfaces of the first and second terminal electrodes and lower surfaces of the first and second external electrodes respectively,
a width of each of the first and second terminals is smaller than a width of the second ceramic body,
the width of each of the first and second terminals disposed on upper, lower and corresponding end surfaces of the second ceramic body is substantially the same, and
a ratio of a width of each of the first and second terminal electrodes to the width of the ceramic chip is greater than or equal to 0.7.

16. The composite electronic component of claim 15, wherein a ratio of a width of the ceramic chip to a width of the multilayer ceramic capacitor is in a range from 0.7 to 1.0.

17. The composite electronic component of claim 15, wherein a ratio of a length of the ceramic chip to a length of the multilayer ceramic capacitor is in a range from 0.7 to 1.0.

18. The composite electronic component of claim 15, wherein a ratio of a sum of a length of the first terminal electrode and a length of the second terminal electrode to the length of the ceramic chip is in a range from 0.3 to 0.6.

* * * * *